United States Patent [19]

Woelk et al.

[11] Patent Number: 5,574,370
[45] Date of Patent: Nov. 12, 1996

[54] NUCLEAR RESONANCE TOMOGRAPHY WITH A TOROID CAVITY DETECTOR

[75] Inventors: Klaus Woelk, Hinsdale; Jerome W. Rathke, Lockport; Robert J. Klingler, Westmont, all of Ill.

[73] Assignee: The United States of America as represented by the United States Department of Energy, Washington, D.C.

[21] Appl. No.: 307,981

[22] Filed: Sep. 2, 1994

[51] Int. Cl.$^6$ .................................................. G01V 3/00
[52] U.S. Cl. ........................... 324/320; 324/318; 324/322
[58] Field of Search ................................. 324/318, 319, 324/320, 322; 333/219, 222–226

[56] References Cited

U.S. PATENT DOCUMENTS 4,053,856  10/1977  Fisher et al. ............................. 333/219
5,045,793  9/1991   Rathke ..................................... 324/318

Primary Examiner—Sandra L. O'Shea
Assistant Examiner—Mack Haynes
Attorney, Agent, or Firm—Bradley W. Smith; Hugh Glenn; William R. Moser

[57] ABSTRACT

A toroid cavity detection system for determining the spectral properties and distance from a fixed point for a sample using Nuclear Magnetic Resonance. The detection system consists of a toroid with a central conductor oriented along the main axis of the toroidal cylinder and perpendicular to a static uniform magnetic field oriented along the main axis of the toroid. An rf signal is inputted to the central conductor to produce a magnetic field perpendicular to the central axis of the toroid and whose field strength varies as the inverse of the radius of the toroid. The toroid cavity detection system can be used to encapsulate a sample, or the detection system can be perforated to allow a sample to flow into the detection device or to place the samples in specified sample tubes. The central conductor can also be coated to determine the spectral property of the coating and the coating thickness. The sample is then subjected to the respective magnetic fields and the responses measured to determine the desired properties.

9 Claims, 4 Drawing Sheets

NUCLEAR RESONANCE TOMOGRAPHY WITH A TOROID CAVITY DETECTOR

CONTRACTUAL ORIGIN OF THE INVENTION

The United States Government has rights in this invention pursuant to Contract No. W-31-109-ENG-38 between the U.S. Department of Energy and the University of Chicago.

BACKGROUND OF THE INVENTION

This invention relates to an improved apparatus for nuclear magnetic resonance (NMR) imaging using a Rotating Frame Imaging (RFI) technique, and in particular, to a method and apparatus for NMR tomographic imaging of a sample to provide chemical shift information and micrometer distance resolution for the sample.

RFI employs a gradient in the radio-frequency field ($B_1$) instead of a gradient in the static main magnetic field ($B_0$), where $B_1$ is perpendicular to $B_0$, to resolve distances associated with respective samples. A major advantage of this method is that the resonance frequency of the nuclear spins associated with the samples is not manipulated to measure the distance. Thus, through the implementation of RFI, associated chemical shifts and distances can be resolved simultaneously.

In the past, it has been difficult to create a $B_1$ gradient that is both mathematically well defined and strong enough to facilitate resolutions of distances below 0.1 mm using RFI. As a result, RFI was found to be unsuitable for NMR microscopy. Now, however, the subject toroid cavity detector satisfies the requirements for implementation of rotating frame microscopy (RFM) to sample analysis.

When a high pressure environment is needed to conduct sample testing, a pressure vessel is used to contain the toroid cavity monitor and the NMR sample or samples or, in the alternative, the toroid cavity monitor houses the sample which in turn is surrounded by the pressure vessel. The composite unit is placed in an externally applied homogeneous magnetic field ($B_0$). The presence of $B_0$ causes the magnetic moments of a targeted class of nuclei in the samples to precess about the field's axis at a rate which is dependent on the magnetic field strength. A coil or toroid internal to the pressure vessel is oriented in such a manner as to apply a magnetic field ($B_1$) perpendicular to $B_0$, and then, the $B_1$ field is alternately energized and de-energized. First, the coil or toroid transmits or energizes, thereby shifting the precession of the magnetic moments away from the $B_0$ axis, and second, the coil or toroid receives the sample's response as the magnetic moments subsequently return to their equilibrium values. In most applications, the received signal from the energized nuclei serves as the input signal for spectroscopic analysis of the sample.

U.S. Pat. No. 5,045,793 teaches the use of a free-standing, helical wound, toroidal coil as an rf detector for use with a high pressure NMR probe. In the subject invention, the transmitter/receiver coil is replaced by a cylindrical toroid cavity detector. In one embodiment of the present invention, the toroid cavity is a cylindrically shaped, hollow body made of copper with closed ends. A teflon coated wire is fed through the base of the cylinder, and is positioned coincident with the major axis of the cylinder. In an alternate embodiment, slots are machined in the wall, top and bottom of the toroidal cylinder to provide access to the toroid cavity for a fluid or gas sample during the NMR experiment. In a further variation, a series of openings and sample holders positioned in the top of the toroidal cylinder provide access for tubes containing the samples to the toroidal cavity detector or resonator.

Toroidal cavity resonators are known in the prior art, Alderman, however, the subject invention differs from the existing art in the method of tuning and in the structure of the toroid cavity resonator employed. In prior art, the toroid was tuned internally by means of the small gap in the cylindrical axis while the subject invention is externally tuned and no gap exits in the teflon coated wire or central conductor which is oriented along the cylindrical axis. The present invention achieves significant results through the presence of a well-defined magnetic field $B_1$ gradient, which has been shown theoretically and experimentally to vary with the inverse of the radial displacement from the axial center of the cavity. As a result, the alternating magnetic field is strongest near the central conductor and drops off towards the outer wall of the toroidal cavity detector. The well-defined magnetic field provides a means to image simultaneously both the chemical shift of the targeted nuclei as well as their radial distance from the center.

The amount of energy that is absorbed/transmitted varies with the location of the sample within the toroidal cavity detector because the efficiency of the energy transfer process is proportional to $B_1$. By varying the transmitter pulse length, multiple distances within the NMR active sample can be resolved. As a result, the major advantage of the new approach is that the chemical shift information is not destroyed by the imaging process as was the case when the measurement was conducted within a homogeneous static magnetic field, $B_0$, by converting the chemical shift information to a measure of distance with a gradient in $B_0$. Also, with this invention, the shim system does not need to be altered.

The toroid cavity of the present invention, has several advantages over the prior art in that it provides a rugged reaction chamber that is readily machined from a variety of alloys, and the alternating magnetic field is highly confined within the cavity detector. Confining the alternating magnetic field minimizes sensitivity losses that occur through magnetic coupling with a high-pressure housing. Most importantly, the cavity detector produces a well-defined magnetic field gradient, which, as noted previously, is predicted to vary with the inverse of the radial displacement from the center of the cavity. The resultant NMR intensity ($I/I_1$) is predicted to depend on the transmitter pulse length, t, according to the following equation $$I/I_0 = 2\pi h \int \sin(\gamma At/r)\, dr$$

where $\gamma$ is the gyromagnetic ratio, h is the height of the toroid, r is the radial distance from the center of the cavity, and A is the proportionality constant defining the magnetic field as follows:

$$B_1 = A/r$$

The 1/r relation for the $B_1$ field suggests that both the NMR sensitivity and the distance resolution should increase for materials that are close to the central conductor. Thus, the toroid cavity NMR resonator is envisioned to be particularly powerful in the characterization of surface layers applied to the central conductor. For example, two layers of tetraflouroethylene fluorocarbon resins were placed around the central conductor of the toroid cavity resonator. The measured thickness of the respective layers was measured as well as their 20 μm separation by means of the NMR imaging data.

Other potential uses for the toroid cavity resonator include in situ monitoring of growth sites during material formation.

Additionally, it should be possible to monitor both the gas phase and the active surface sites during chemical vapor deposition by heating the central conductor of the toroid cavity resonator. The toroid cavity detector can be used with a high pressure metal probe housing to conduct measurements at high pressures. Thus, a supercritical fluid at high pressure can be used as the solvent medium to accelerate the diffusion of viscous preceramic polymer reactants into permeable composite materials.

The toroid cavity detectors consist of an inner wire (central conductor) and an outer cylindrical body. With this arrangement, the $B_1$ field is completely confined within the cavity. It is strongest near the central conductor and drops off as the inverse of the distance toward the outer wall. Both sensitivity and distance resolution increase with the gradient in $B_1$ and consequently, the toroid detector is well suited for NMR microscopy of films that uniformly surround the central conductor. In addition, the toroid cavity detectors appear to be useful for investigations of solids and polymers where broad lines usually limit the spatial resolution to 50–100 μm. High-pressure and high-temperature capabilities of toroid cavities enable measurements of penetration rates in polymer or ceramic films in situ. In addition, electrochemical processes can be monitored, when the central conductor is used as a working electrode.

Since the $B_1$ field is strongest near the toroid's central conductor and drops off as the wall is approached, the amount of energy that is absorbed by any sample nuclei present varies with its location within the torus. Differences in the energy absorbed by the nuclei are manifest in their respective pulse rotation angles. Hence, the distances of various types of sample nuclei from the central conductor can be resolved by determining their pulse rotation angles.

Conventional NMR imaging techniques sacrifice all of the spectral details as a side effect of the process used to encode distance information. In contrast, complete NMR spectral information is retained during signal processing with the toroid cavity imaging method. Additionally, because of the strong gradient that is intrinsic to the torus, the theoretical spacial resolution of the toroid cavity imager is better than is possible with conventional MRI. Also, spatial resolution with the toroid cavity imager is less dependent on the line widths of the NMR signals used in the measurements because chemical shift information is not used to determine the distance as it is in conventional MRI.

Rotating Frame Imaging (RFI) uses the $B_1$ field gradient of an asymmetrically shaped NMR transmitter coil to achieve its spatial resolution. The transmitted energy, and thus, the pulse rotation angle of the NMR active nuclei varies with the $B_1$ field strength. Accordingly, a gradient can be used for spin localization. Through incremental increases in the pulse width, a set of amplitude-modulated spectra is derived in which the modulation frequencies yield the spatial information. Using a two-dimensional Fourier transformation, both the spatial and the chemical-shift information is resolved. This is a major advantage of the RFI technique over common MRI (Magnetic Resonance Imaging) where the chemical shift information is converted into a measure of distance by using a gradient in the main magnetic field $B_0$.

NMR microscopy has always suffered from a lack of a $B_1$ field gradient that is both accurate and strong enough to resolve distances less than 0.1 mm. The toroid cavity detector of the subject invention satisfies RFM (rotating frame microscopy) requirements and facilitates resolution of distances at the micrometer level while simultaneously conserving the chemical-shift information.

Since, the $B_1$ field of toroid NMR detectors is completely confined within the torus, the use of a cavity instead of a coil to form the torus eliminates the irregularities found in the field of the coil due to the spaces between the individual turns of the coil.

It is the object of this invention to provide a NMR sampling probe which can determine the chemical shift of the targeted nuclei as well as their radial distance from the center.

It is a further object of this invention to teach a toroid cavity detector which is tuned externally.

Another object of this invention provides for sampling the targeted nuclei under high pressure conditions when coupled with a high pressure housing.

Additional advantages, objects and novel features of the invention will become apparent to those skilled in the art upon examination of the following and by practice of the invention.

SUMMARY OF THE INVENTION

To achieve the foregoing and other advantages, this invention comprises a toroid cavity resonator consisting of an outer cylindrical body and an inner wire located along the central axis of the cylindrical body. When energized, the cavity produces a $B_1$ field which varies as the inverse of the radius where the radius is measured from the inner wire where the $B_1$ field is perpendicular to a uniformly applied $B_0$ field which parallels the axis of the toroid. Using the subject resonator and Rotating Frame Imaging, chemical shifts and distances from the central axis of below 0.1 mm are simultaneously resolvable. Pressure vessels can be used to place the resonator in a high pressure environment to facilitate measurements under high pressure conditions.

BRIEF DESCRIPTION OF THE DRAWINGS

The present invention is illustrated in the accompanying drawings where.

DETAILED DESCRIPTION OF THE INVENTION

Figure 1:
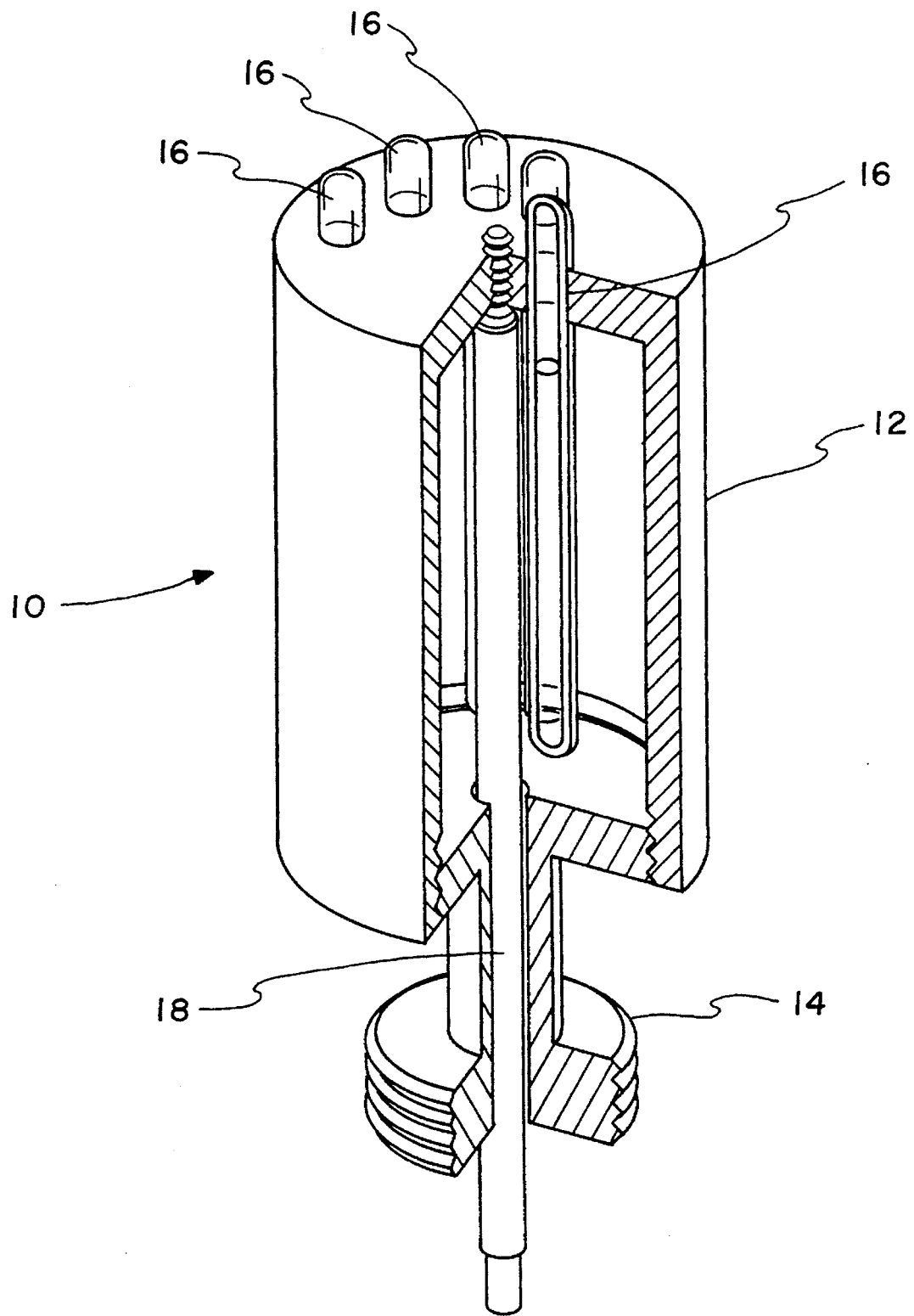
FIG. 1 is a schematic showing one embodiment of the toroid detector system.

FIG. 1 depicts the toroid cavity detector 10. The detector 10 is machined from metal stock to form a toroid cavity resonator. The toroidal 12 portion of the detector 10 is, in the preferred environment, machined from a cylinder of elemental metal or alloy to form a hollow cylinder open at one end and closed at the other. The open end of the toroid 12 is tapped to receive a similarly threaded base 14. The closed end of the toroid 12 is machined to receive a series of capillary tubes 16 which contain the samples and where the capillary tubes 16 are incrementally spaced on radials originating from the major axis of the toroid 12. A Teflon coated wire 18 is positioned along the major axis of the toroid detector 10 forming a central conductor and is the source for the $B_1$ field when the wire 18 is energized, by a pulse generating transmitter 17, to produce the rf field gradient where the field strength is inversely proportional to the radial distance from the central conductor 18. A receiver 19 is coupled to the central conductor 18 to receive the response of the sample to the uniform and pulsed magnetic fields.

Figure 2:
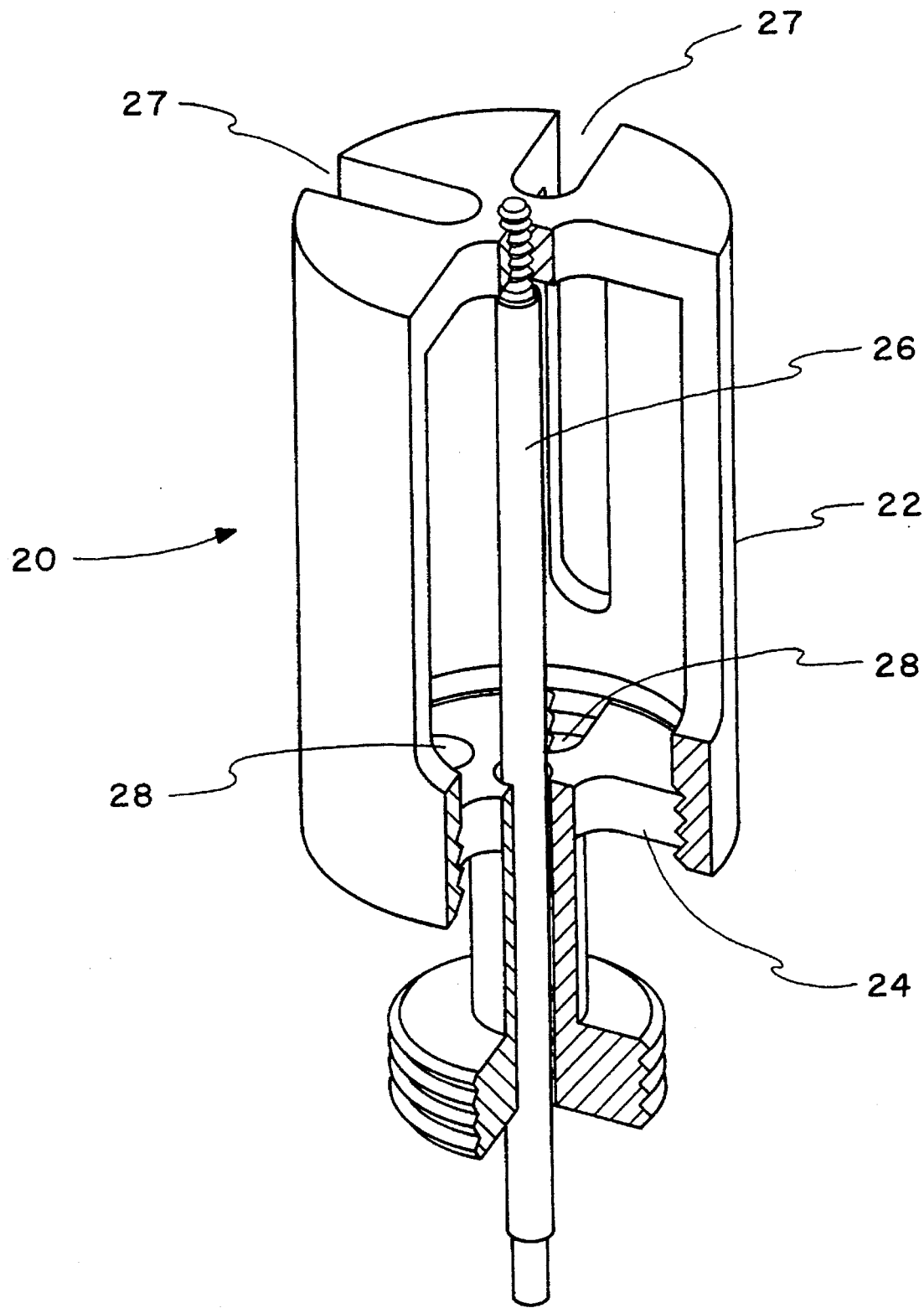
FIG. 2 illustrates an alternate embodiment of the toroid detector system.

FIG. 2 represents an alternate embodiment of the toroid detector 20. In this embodiment 20, again a cylindrical body 22 is hollowed out where one end of the cylinder 22 closed and the other end is opened. The open end is tapped to receive a similarly threaded base 24 which is attached to the cylindrical body 22 to form a toroid cavity. A Teflon coated wire 26 passes through the base 24 and connects with the closed end of the hollowed out cylinder 22. The wire 26 is coincidental with the major axis of the cylinder 22 and the long axis of the base 24 slits 27 are cut into the wall and closed end of the cylinder 22 to allow either sample liquids or gasses to flow into the toroid detector 20. Similarly, slits 28 are cut into the base 24 of the toroid cavity 20 to further permit the flow of gases or liquids through the cavity 20. A pulse generating transmitter 23 and receiver 25 are coupled to the wire 26.

Figure 3:
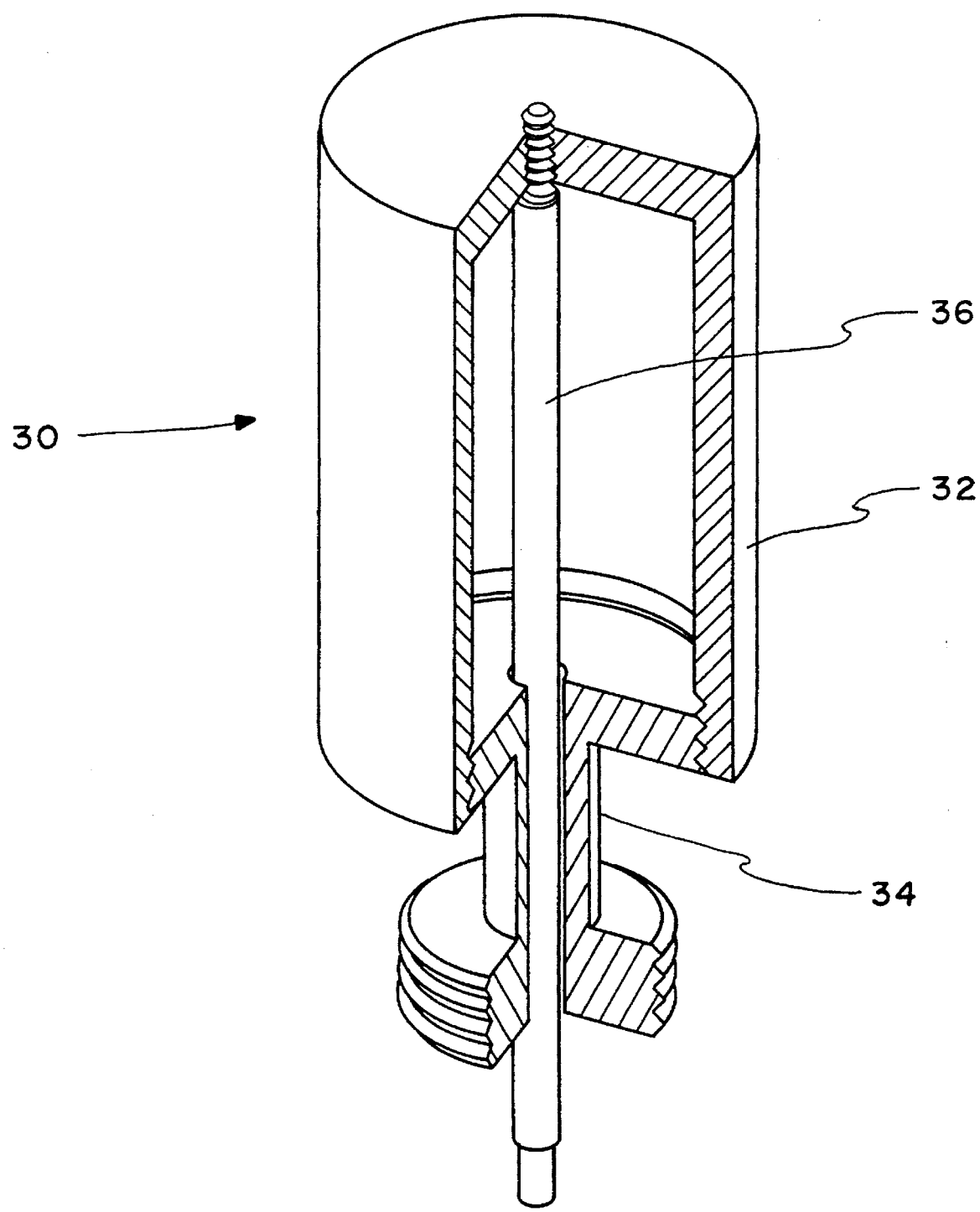
FIG. 3 is a further alternate embodiment of the toroid detection system.

FIG. 3 represents a further embodiment of the toroid cavity detector 30. In a similar manner the cylindrical body 32 of the detector 30 is machined from a cylinder of elemental metal or alloy to form a hollow cylinder closed at one end and open at the opposing end. The open end of the toroid 32 is tapped to receive a similarly threaded base 34. A Teflon coated wire 36 is positioned along the major axis of the toroid 32 and is threaded at one end to attach it to the closed end of the hollow cylinder. The wire 36 is also oriented along the long axis of the base 34. When the base 34 is attached to the open end of the hollow cylinder 32 a closed vessel ensues and specimens can be placed in the closed space for testing when the central conductor 36 is energized at an rf frequency, by a pulse generating transmitter 32, to produce a magnetic field $B_1$ whose gradient varies inversely as the radius of the cylinder. A receiver 38 is coupled to wire 36 to receive the response of the sample to the uniform and pulsed magnetic fields.

Figure 4:
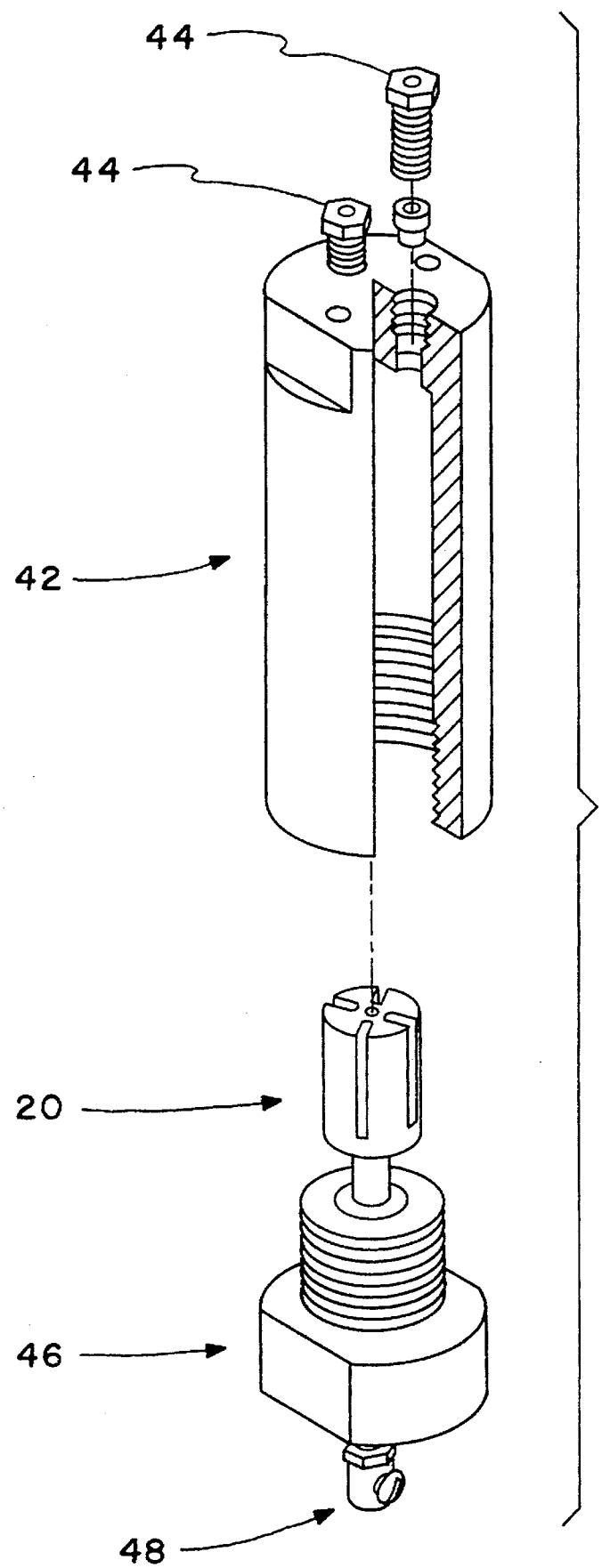
FIG. 4 show the toroid detector of FIG. 2 in conjunction with a high pressure reactor body.

FIG. 4 depicts the coupling of a high-pressure Nuclear Magnetic Resonance (NMR) probe and the toroid detector. In this figure, only the embodiment of FIG. 2 is displayed; however, the embodiment of FIGS. 1 or 3 could also be employed in a similar manner with the high-pressure NMR probe. The high-pressure NMR probe is consists of a reactor body 42 in the form of a hollow cylinder with one end opened and the other closed. The closed end of the reactor body 42 is drilled and to receive gas (fluid) connections 44 which are similarly threaded and which serve to link the probe to external sample sources (not shown). The open end of the reactor body 42 is tapped to receive a similarly threaded bottom plug 46. The bottom plug is also tapped, at one end of the plug 46, to receive a threaded rf feedthrough 48 and at the other end of the plug to receive the threaded toroid cavity detector 20 base. Both the bottom plug 46 and the rf feedthrough 48 have similarly positioned holes to allow the Teflon coated wire 26 to pass from and external rf source 49 to the toroid cavity detector 20. A receiver 50 is coupled to the wire 26 to receive the response of the sample to the applied magnetic fields.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical applications and should enable others skilled in the art to utilize the invention in various embodiments and with various modifications as are suited to the particular use contemplated. It is intended that the scope of the invention be defined by the claims appended hereto.

The embodiment of this invention in which an exclusive property or privilege is claimed is defined as follows:

1. A toroid cavity detection system for detecting the spectral properties of a sample and for determining the distance from a fixed position for the sample using Nuclear Magnetic Resonance comprising:

a hollow conducting cylinder having a long axis and an inner and outer surface and a closed end opposing an open end where said inner surfaces of said hollowed cylinder are approximately parallel to said outer surfaces of said cylinder;

a conducting base where a first end of said base is joined to said cylinder at said cylinder's open end, where said second end of said base is configured to attach to a probe, and where the combination of said conducting base with said cylinder enclose the sample;

a central insulated conductor which passes through an opening in said conducting base and is attached to said closed end;

an external magnetic means for producing a uniform external magnetic field which is oriented parallel to said long axis of said cylinder;

a pulse generating transmitter means coupled to said conductor for developing a time variable magnetic field internal to said cylinder; and a receiving means coupled to said conductor for processing a sample response to said external magnetic and said time variable magnetic field.

2. The system of claim 1 where said central conductor has a Teflon coating.

3. The system of claim 1 where said hollowed conducting cylinder has a plurality of separate openings extending from said outer surface through to said inner surface.

4. The system of claim 3 where said conducting base has a plurality of separate openings extending through said base.

5. The system of claim 1 in which a plurality of sample holders are aligned with a plurality of separate holes extending through said closed end of said cylinder to hold sample tubes during nuclear magnetic resonance testing.

6. The system of claim 1 in which said hollow conducting cylinder is formulated from a conducting metal or metal alloy.

7. A high-pressure toroid cavity detection system for determining the spectral properties and measured distance from a fixed position for a sample using Nuclear Magnetic Resonance comprising:

a hollow conducting cylinder having an inner and outer surface and a closed end opposing an open end where said inner surfaces of said hollowed cylinder are approximately parallel to said outer surfaces of said cylinder and where said cylinder has a plurality of separate holes or slits which connect said inner surface to said outer surface;

a conducting base where a first end of said conducting base is joined to said cylinder at said cylinder's open end, where a second end of said base is configured to attach to a probe, and where the combination of said conducting base with said cylinder enclose the sample;

a central insulated conductor which passes through an opening in said metallic base and is attached to said closed end;

a high-pressure probe including a reactor body having an interior chamber and coupled to a bottom plug capable of containing a fluid or a gas under high-pressure without undergoing failure where said bottom plug is performed to allow passage of said central conductor and where said conducting base is coupled to said bottom plug so that said conducting cylinder is internal to said interior chamber;

an rf feedthrough connected to said bottom plug where said rf feedthrough is perforated to allow passage of said central conductor;

an external magnetic means for producing a uniform external magnetic field which is oriented parallel to said long axis of said cylinder;

a pulse generating transmitter means coupled to said conductor for developing a time variable magnetic field internal to said cylinder; and a receiving means coupled to said conductor for processing a sample response to said external magnetic and said time variable magnetic field, and a plurality of gas or liquid connectors which are attached to said reactor body at a plurality of connection ports where said ports perforate said reactor body.

8. A method for determining spectral and distance properties for a sample subject to Nuclear Magnetic Imaging comprising:

placing a sample in a toroid cavity detector;

placing said toroid cavity detector in a uniform magnetic field aligned so that the major axis said detector coincides with said magnetic field;

applying an rf signal to a central conductor in said toroidal cavity detector to produce a second magnetic field perpendicular to said uniform magnetic field;

analyzing a set of response data from a corresponding set of sample nuclei to determine spectral information and distance information for said sample nuclei.

9. A method for determining spectral and distance properties for a sample subject to Nuclear Magnetic Imaging comprising:

placing a sample coating on a central conductor in a toroid cavity detector;

placing said toroid cavity detector in a uniform magnetic field aligned so that the major axis said detector coincides with said magnetic field;

applying an rf signal to said central conductor in said toroidal cavity detector to produce a second magnetic field perpendicular to said uniform magnetic field;

analyzing a set of response data from a corresponding set of sample nuclei to determine spectral information and distance information for said sample nuclei;

analyzing said response data to determine a thickness for said coating.

* * * * *